United States Patent [19]
Ishimaru

[11] Patent Number: 5,960,272
[45] Date of Patent: Sep. 28, 1999

[54] ELEMENT-ISOLATING CONSTRUCT OF A SEMICONDUCTOR INTEGRATED CIRCUIT HAVING AN OFFSET REGION BETWEEN IMPURITY DOPED REGIONS, AND PROCESS OF MANUFACTURING THE CONSTRUCT

[75] Inventor: Kazunari Ishimaru, Yokohama, Japan

[73] Assignee: Kabushiki Kaisha Toshiba, Tokyo, Japan

[21] Appl. No.: 08/732,846

[22] Filed: Oct. 15, 1996

[30] Foreign Application Priority Data

Oct. 16, 1995 [JP] Japan ..................................... 7-267013

[51] Int. Cl.⁶ ................................................ H01L 21/8238
[52] U.S. Cl. .......................... 438/207; 438/196; 438/218; 438/294; 438/318
[58] Field of Search ..................................... 438/207, 196, 438/218, 294, 318, 353, 414, 418, 419, 358, 203

[56] References Cited

U.S. PATENT DOCUMENTS 4,637,125  1/1987  Iwasaki et al. ........................ 438/203
5,141,881  8/1992  Takada et al. .......................... 365/233
5,494,844  2/1996  Suzuki ................................... 438/207

OTHER PUBLICATIONS

Stanley Wolf, Ph.D. "Silicon Processing for the VLSI ERA vol. 2: Process Integration" pp. 28–66 and 498–500 Lattice Press, Sunset Beach, CA, USA.

Primary Examiner—Charles Bowers
Assistant Examiner—Craig Thompson
Attorney, Agent, or Firm—Loeb & Loeb LLP

[57] ABSTRACT

The present invention is to provide a semiconductor integrated circuit having bipolar transistor elements with a reduced isolating distance between adjacent transistors and a reduced collector/substrate capacitance. In the surface of a P-type semiconductor substrate, N⁺ type regions are formed serving as buried collector regions of bipolar transistors TR1 and TR2. Between the N⁺ type regions, a P-type region for element isolation is provided not in contact with the N⁺ type regions. A P-type impurity concentration in the peripheral portions of N⁺ type regions is equal to that of the semiconductor substrate. The insulating film serving as an element-isolating layer is provided on the P-type region in contact therewith and thus electrically isolates adjacent bipolar transistors.

7 Claims, 5 Drawing Sheets

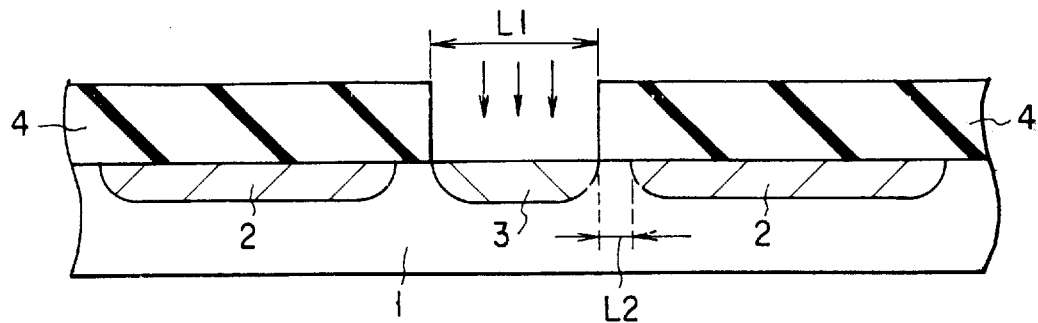
F I G. 1
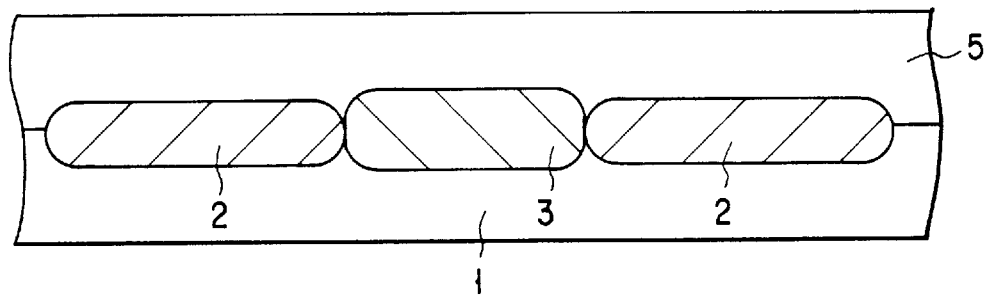
F I G. 2
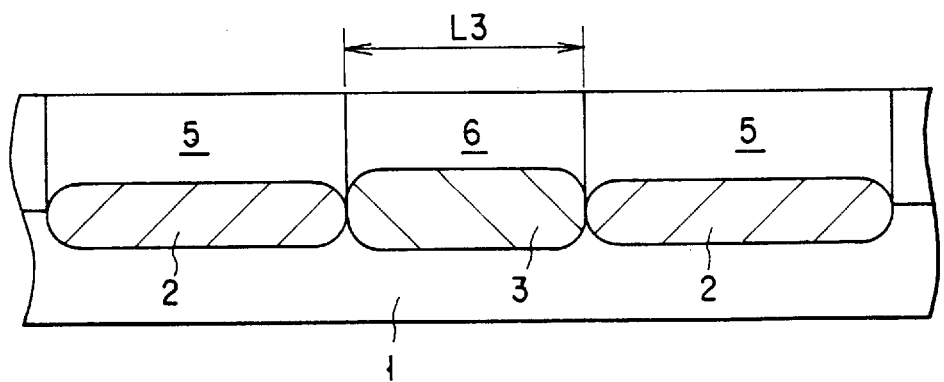
F I G. 3
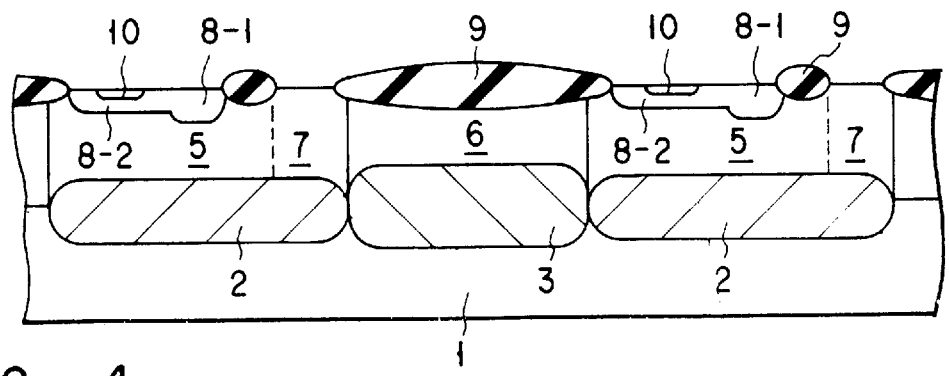
F I G. 4

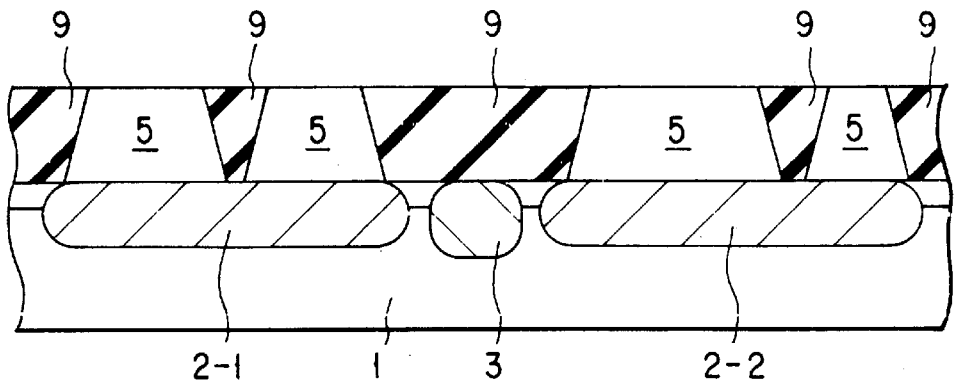
F I G. 9
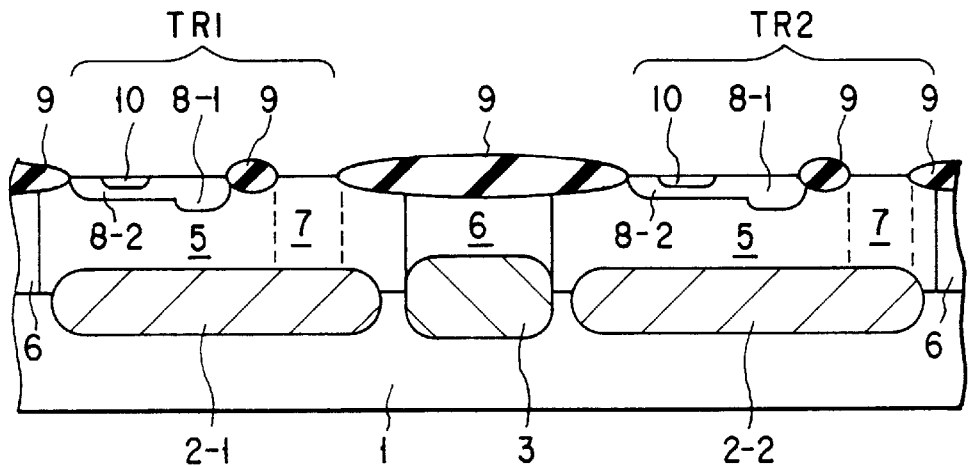
F I G. 10
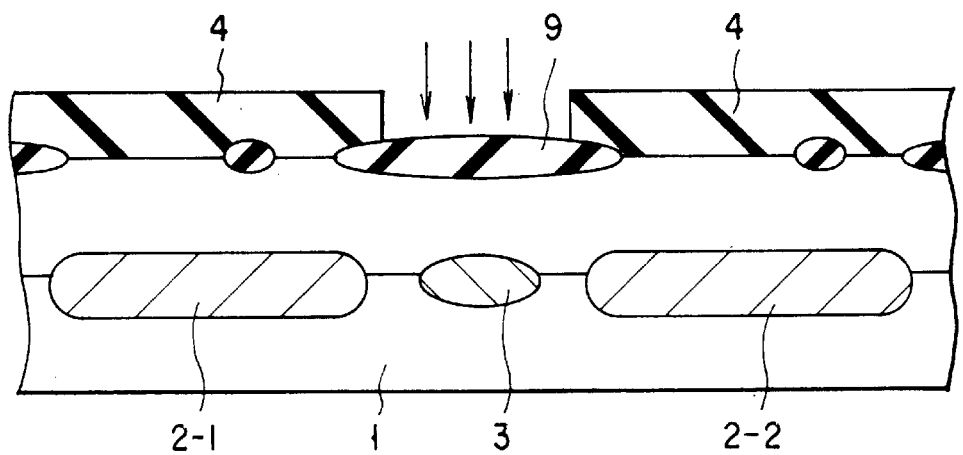
F I G. 11

ELEMENT-ISOLATING CONSTRUCT OF A SEMICONDUCTOR INTEGRATED CIRCUIT HAVING AN OFFSET REGION BETWEEN IMPURITY DOPED REGIONS, AND PROCESS OF MANUFACTURING THE CONSTRUCT

BACKGROUND OF THE INVENTION

1. Field of the Invention

The present invention specifically relates to an element-isolating construct of a semiconductor integrated circuit for isolating a plurality of element regions formed on a semiconductor substrate. The present invention also related to a process for manufacturing the element-isolating construct.

2. Description of the Related Art

When an integrated circuit is conventionally formed by incorporating bipolar-transistors, each of the bipolar transistors must be electrically separated to ensure a reliable operation. The electrical isolation of bipolar transistors can be attained by surrounding each of the bipolar transistors with the region doped with impurities of the opposite conductive type to those of the collector region.

Hereinbelow, we will explain a process for forming an element-isolating region, taking an NPN transistor as an example, with reference to the accompanying drawings.

First, as shown in FIG. 1, a large amount of N-type impurities is introduced into a predetermined buried collector region of a bipolar transistor provided on a P-type silicon substrate 1, forming an N+ type region 2. As the N$^+$ type impurities, As (arsenic) or Sb (antimony) is generally introduced by means of solid-phase diffusion. After an opening having distance L1 is formed between the N$^+$ type regions 2 of adjacent bipolar transistors, by using a resist 4, impurity ions are implanted through the opening to form a P-type region 3 responsible for isolating adjacent bipolar transistors. Then, an N-epitaxial layer 5 is grown, as shown in FIG. 2. In the epitaxial layer 5 immediately above the buried P-type region 3, a P-type region 6 is formed, as shown in FIG. 3. The isolating region of bipolar transistors is thereby accomplished.

FIG. 4 is a cross sectional view of a bipolar transistor region obtained after the construct shown in FIG. 3 is treated in subsequent processing steps, and more specifically, shows the isolation profile of adjacent bipolar transistors. As is apparent from FIG. 4, the element regions are separated by an oxide film 9. To decrease the collector resistance, a deep N-type region 7 is formed extending to the buried collector region. In a predetermined base contact region of a bipolar transistor, a P-type region 8-1 is selectively formed by ion implantation. Also, using ion implantation, another P-type region 8-2, shallow and lightly doped is formed extending to the P-type region 8-1. The region 8-2 acts as the base region. In the surface of the P-type base region 8-2, an N-type region 10 is formed as the emitter.

In the manufacturing process thus constituted, the temperature for epitaxial layer growth is as high as 1,000° C. or more. As a result, impurities of the heavily-doped N+-type region 2 and the P-type region 3 are diffused vertically and laterally in the epitaxial layer 5. In this case, if the offset distance L2 (indicated in FIG. 1) between the buried N$^+$ type region 2 and P-type region 3 is designed to be shorter than the sum of the distances of impurity laterally diffused from the regions 2 and 3, the region 2 will be in contact with the region 3 as shown in FIG. 2.

In practice, the impurities in the buried P-type region 3 are tend to be diffused easier than those in the buried N$^+$ type region 2. Since the impurity concentration of the P-type region 3 is generally higher than that of the substrate 1, if the buried layers 2 and 3 come in contact with each other, capacitive coupling of the N$^+$ type region 2 will be increased. In other words, a collector/substrate capacitance of a transistor will be larger.

However, to ensure a high-speed operation of a bipolar transistor, it is important to reduce the collector/substrate capacitance. Therefore, each of the impurity concentrations of the N+-type region 2 and P-type region 3 must be maintained as low as possible. To satisfy the requirement, it is considered that the P+ type region 3 is formed at a certain distance (offset distance) apart from the N$^+$ type region 2 sufficiently to avoid the contact of both regions even if heating is applied thereto during epitaxial growth. In this method, however, the offset distance L2 will be inevitably long, offering a disadvantage to high integration of the semiconductor circuit.

To suppress the lateral diffusion, it is conceivable that the epitaxial growth is carried out at reduced temperature. However, if the temperature is reduced during the epitaxial growth, the quality of the epitaxial layer 5 and the epitaxial growth rate will decrease, resulting in a low productivity. It is also conceivable that the impurity concentration of the P-type region 3 is reduced. However, to ensure reliability, the impurity concentration of the P-type region 3 and the isolation distance L3 (indicated in FIG. 3) must be inversely proportional. Therefore, in the case where the impurity concentration of the P-type region 3 is reduced, the isolation distance L3 must be increased, making it difficult to attain the high integration density.

In the case where an element isolating construct is formed in accordance with any one of manufacturing processes mentioned above, it is impossible to form a semiconductor circuit having a reduced distance between adjacent transistors and a low collector/substrate capacitance.

As an alternative way to reduce the isolation distance between the adjacent bipolar transistors, a trench as deep as 4–6 μm may be employed. Since adjacent transistors are physically isolated in the trench isolation method, the buried P-type region 3 is not required. The deep-trench isolation technique is employed usually in very high-speed bipolar transistor integrated circuits. The adjacent bipolar transistors are isolated by a trench which is deeper than the buried P-type region 3. If such a trench isolation construct is applied to the semiconductor circuit, it will be possible to reduce isolation distance L3 (shown in FIG. 3) and lower the collector/substrate capacitance, realizing the semiconductor circuit with high performance. However, the trench isolation has the following disadvantages: (1) manufacturing process is complicated and (2) another method such as a shallow trench isolation or a LOCOS process must be used together in the case where a wide element-isolating region is formed. Many steps are therefore required to manufacture the semiconductor circuit, increasing a manufacturing cost.

As mentioned above, it has been hitherto impossible to construct a semiconductor circuit having a reduced isolation distance between transistors and a low collector/substrate capacitance, without an increase in manufacturing steps and cost.

SUMMARY OF THE INVENTION

The present invention has been made in consideration of the aforementioned circumstances. The object of the present invention is to provide an element-isolating construct of a semiconductor circuit, and a process for manufacturing the construct. The element-isolating construct is characterized by enabling to use a conventional element isolation method with no complicated process such as a deep trench isolation; to reduce a distance between adjacent bipolar transistors without an increase of a collector/substrate capacitance of the bipolar transistor; and to construct a highly integrated bipolar transistor of high performance, at low cost.

The object of the present invention is achieved by an element-isolating construct of a semiconductor integrated circuit comprising: a semiconductor substrate of a first conductive type; buried impurity regions of a second conductive type corresponding to each of element regions, selectively formed on the semiconductor substrate; a buried impurity region of a first conductive type for element isolation, which contains impurities at a larger amount than the semiconductor substrate, and which is interposed between the buried impurity regions of a second conductive type apart therefrom; an epitaxial layer of a second conductive type which contains impurities at a smaller amount than the buried impurity regions of a second conductive type and which is formed over the semiconductor substrate including at least the buried impurity regions of a second conductive type; and an element-isolating layer formed above the buried impurity region of a first conductive type, and included in the epitaxial layer.

The object of the invention can be also be achieved by a process for manufacturing an element-isolating construct of a process for manufacturing an element-isolating construct of a semiconductor integrated circuit, comprising the steps of: selectively forming buried impurity regions of a second conductive type corresponding to each of element regions, on a semiconductor substrate of a first conductive type; growing an epitaxial layer of a second conductive type over the semiconductor substrate including the buried impurity regions of a second conductive type, the epitaxial layer containing impurities of a second conductive type in a smaller amount than the buried impurity regions of a second conductive type, forming a buried impurity region of a first conductive type in the semiconductor substrate, apart from the buried impurity regions of a second conductive type to electrically isolate the buried impurity regions of a second conductive type, by ion implantation injecting ions from the surface of the epitaxial layer immediately above a predetermined position of the buried impurity region of a first conductive type at a doping concentration higher than that of the semiconductor substrate, and isolating each of the element regions on the buried impurity regions of a second conductive type, wherein the buried impurity region of a first conductive type is formed not in contact with the buried impurity regions of a second conductive type even after the requisite heating is applied, and an impurity concentration of a first conductive type contained in the peripheral portions of the buried impurity regions of a second conductive type is equal to an impurity concentration of a first conductive type of the semiconductor substrate.

In the present invention, after an epitaxial layer is formed, a buried impurity-doped region of a first conducting type responsible for electrically isolation of adjacent elements is formed by ion implantation at a predetermined distance apart from the buried impurity doped regions of a second conducting type. Since such a construct is free from high-temperature heating treatment during epitaxial growth, the impurity diffusion from the buried impurity-doped region of a first conducting type is prevented, suppressing an increase of the capacitive coupling.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 1 to 4 are cross sectional views of element isolation constructs used in a conventional bipolar transistor integrated circuit, for use in explaining the manufacturing steps in consecutive order;

FIG. 9 is a fourth cross sectional view of the element-isolating construct on the way of manufacturing the construct shown in FIG. 5, for use in explaining the manufacturing process;

FIG. 10 is a cross sectional view of the element-isolating construct of the semiconductor integrated circuit according to a second embodiment of the present invention;

FIG. 11 is a cross sectional view of the element-isolating construct on the way of manufacturing the construct shown in FIG. 10, for use in explaining the manufacturing process;

DETAILED DESCRIPTION OF THE PREFERRED EMBODIMENTS

Figure 5:
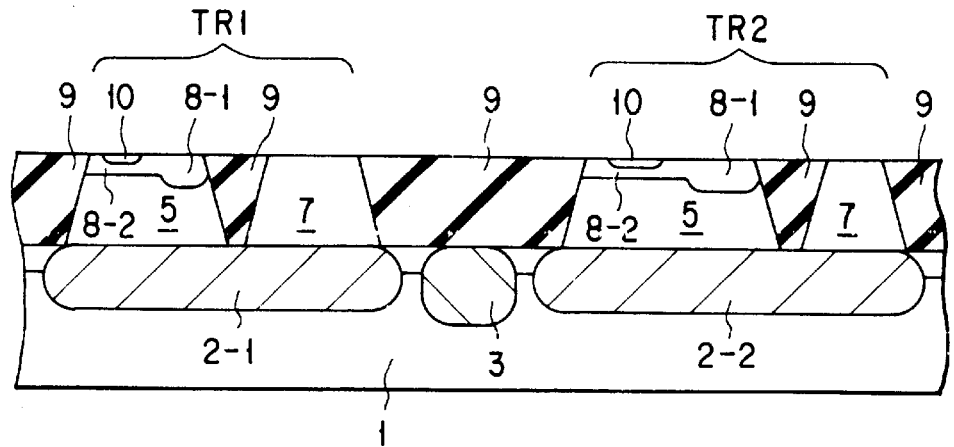
FIG. 5 is a cross sectional view of an element-isolating construct of the semiconductor integrated circuit according to a first embodiment of the present invention.

FIG. 5 is a cross sectional view of an element-isolating construct of the semiconductor integrated circuit, according to a first embodiment of the present invention, and more specifically, shows a shallow-trench element-isolating construct in a bipolar transistor integrated circuit. The element-isolating construct is formed as follows: In the P-type semiconductor substrate 1, N+ type regions 2-1 and 2-2 are respectively formed which serve as buried collector regions of bipolar transistors TR 1 and TR 2. Between the N+ region 2-1 and 2-2, P-type region 3 as the element-isolating construct is formed apart from each of N+ type regions 2-1 and 2-2. The P-type impurity concentration of the peripheral regions of the N+ type regions 2-1 and 2-2 is equal to that of the semiconductor substrate 1.

Over the semiconductor substrate 1 including the N+ type regions 2-1, 2-2 and P-type region 3, an N epitaxial layer 5 is formed. The epitaxial layer 5 is then selectively removed. To the vacant space with epitaxial layer removed, an oxide film 9 is formed an element isolation region.

In each of the surface regions of the epitaxial layer 5 immediately above the N+ type regions 2-1 and 2-2, a P-type region. n 8-1 and a P-type region 8-2 are formed. The P-type region 8-2 is a shallow and lightly doped region extending to the P-type region 8-1. The P-type region 8-1 serves as a base contact and the P-type region 8-2 as a base region with respect to each of bipolar transistors TR1 and TR2. In the surface of the P-type base region, an N-type region 10 is formed as the emitter. An N-type region 7 is the collector region obtained by implanting N-type impurities into the epitaxial layer 5 so as to reach the buried collector, N+ type region 2, thereby reducing collector resistance. The insulating film 9 on the P-type region 3 in contact therewith is an element isolation layer, electrically separates adjacent bipolar transistors TR1 and TR2.

Figure 6:
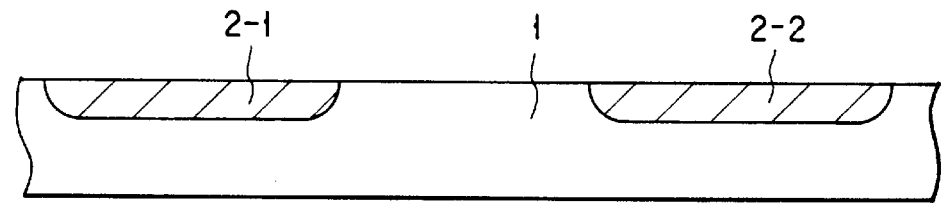
FIG. 6 is a first cross sectional view of an element-isolating construct on the way of manufacturing the construct shown in FIG. 5, for use in explaining the manufacturing process.
Figure 7:
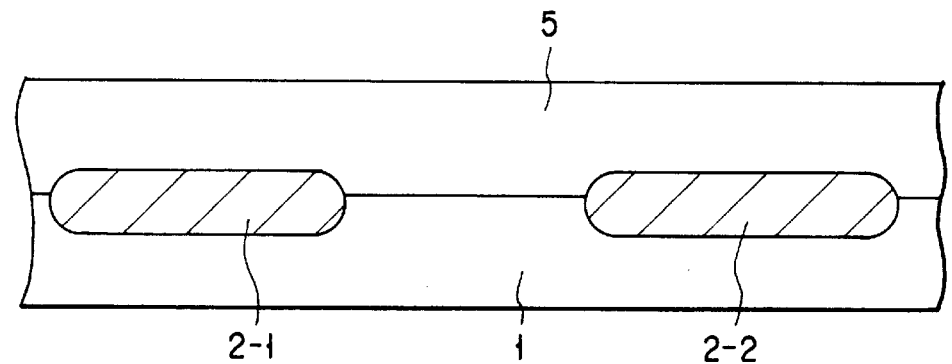
FIG. 7 is a second cross sectional view of the element-isolating construct on the way of manufacturing the construct shown in FIG. 5, for use in explaining the manufacturing process.

Hereinbelow, the process for manufacturing the element isolating construct shown in FIG. 5 will be explained with reference to cross sectional views of the construct on the way of manufacturing. First, as shown in FIG. 6, in a P-type semiconductor substrate 1 having a resistivity of 4–6 Ω.cm, an buried collector regions, N+ type regions 2-1 and 2-2, of bipolar transistors are selectively formed by means of Sb (antimony) solid diffusion or the like. Thereafter, as shown in FIG. 7, the N-type epitaxial layer 5 having a resistivity of 0.1–1.0 Ω.cm is grown in a thickness of about 0.5–2.0 μm. Any epitaxial growth conditions may be used as long as they are commonly used for the epitaxial growth. Specific conditions are not required herein. It is rather better to grow the epitaxial layer under the conditions which make it difficult to diffuse impurities from the buried N+ type region 2 in the lateral direction.

Figure 8:
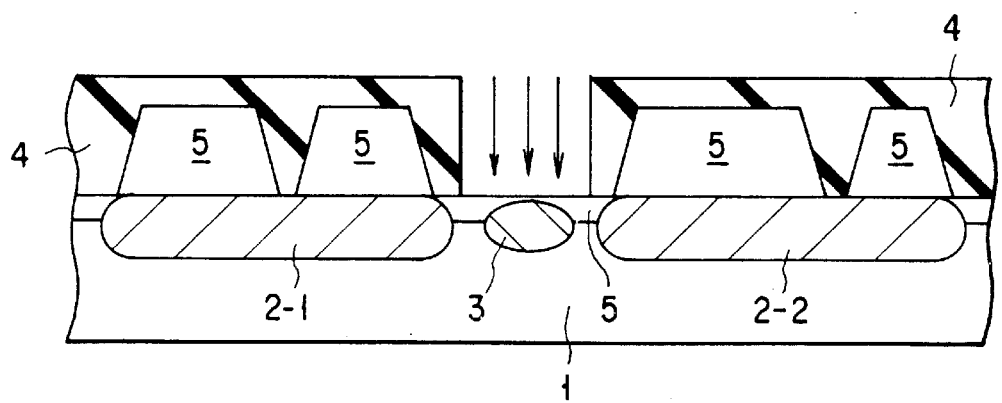
FIG. 8 is a third cross sectional view of the element-isolating construct on the way of manufacturing the construct shown in FIG. 5, for use in explaining the manufacturing process.

Subsequently, as shown in FIG. 8, the regions of the epitaxial layer 5 to be element-isolating regions are selectively removed by means of photolithography to form desired trenches. After a resist film 4 is formed over the resultant structure, a P-type region 3 is selectively formed only in the predetermined bipolar transistor isolating region by implanting impurity ions, for example, boron (B) ions, at an accelerating voltage of 160 keV and in an injection amount of about $3 \times 10^{13}$ cm$^{-2}$. The acceleration voltage and the injection amount may be appropriately determined depending upon the depths of the N+ type regions 2-1 and 2-2 and the distance between them.

The distance between adjacent N+ type regions 2-1 and 2-2 is determined by the diffusion distance varying depending on the conditions of the heating step performed after the formation of the P-type region 3. For example, in the case of trench isolation, diffusion of impurities scarcely occurs in the lateral direction since no high-temperature and long-time heating such as LOCOS (local oxidation) is required. In the conventional case where the buried P-type region 3 is formed prior to the formation of an epitaxial layer, heating must be performed at 1200° C. for about one hour during the epitaxial growth and at 1000° C. for about 5–8 hours during LOCOS formation. Therefore, impurity diffusion occurs significantly. In contrast, in the case where P-type region 3 is formed according to the process of the present invention, heating is performed only at 1000° C. for one hour. Impurity diffusion occurs at a distance of at most 0.2 μm in the lateral direction. The P-type region 3 may be therefore formed at a distance of 0.5 μm apart from each of N+ type regions 2-1 and 2-2 adjacent to each other. As a result, the P-type impurity concentrations in the peripheral regions of the N+ type regions 2-1 and 2-2 are maintained almost equal to that of the substrate, preventing an increase of the capacitance.

After the buried P-type region 3 is formed, trenches are filled with an insulating film, e.g. the oxide film 9, by means of a CVD method and the like, as shown in FIG. 9. Subsequently, the resultant structure is processed in accordance with commonly-known bipolar transistor formation steps to accomplish transistor elements (TR1 and TR2) shown in FIG. 5. As an alternative, it is also possible that a P-type region 3 is formed by ion implantation after an oxide film 9 is formed.

If the element-isolating construct is formed according to the process of the present invention, it is possible to obtain the element-isolating construct with a reduced distance between transistor elements and with a low collector/substrate capacitance. Furthermore, since the deep-trench isolation technique requiring other element isolation methods is not necessary for manufacturing the construct of the present invention, low cost manufacturing can be attained.

FIG. 10 is a cross sectional view of the element-isolating construct of the semiconductor integrated circuit according to a second embodiment of the present invention, and more specifically, shows the element isolating construct of a bipolar transistor integrated circuit formed by using a LOCOS element isolation process. The element isolating construct is constructed as follows: in the P-type semiconductor substrate 1, buried collector regions, N+ type regions 2-1 and 2-2 are formed with respect to bipolar transistors TR 1 and TR 2, respectively. Between the N+ region 2-1 and 2-2, an element isolating construct, P-type region 3 is formed apart from each of N+ type regions 2-1 and 2-2. The P-type impurity concentration of the peripheral portions of the N+ type regions 2-1 and 2-2 are equal to that of the semiconductor substrate 1.

Over the semiconductor substrate 1 including the N+ type regions 2-1, 2-2 and P-type region 3, an N epitaxial layer 5 is formed. In the surface of the epitaxial layer 5, an oxide film 9 for element isolation selectively formed. In each of the surface regions of the epitaxial layer 5 immediately above the N + type regions 2-1 and 2-2, a P-type region 8-1 and a P-type region 8-2 are formed. The P-type region 8-2 is a shallow and lightly doped region extending to the P-type region 8-1. The P-type region 8-1 serves as a base contact and the P-type region 8-2 as a base region with respect to each of bipolar transistors TR1 and TR2. In the surface of the P-type base region 8-2, an N-type region 10 is formed as the emitter. An N-type region 7 is the collector region obtained by implanting N-type impurities into the epitaxial layer 5 so as to reach the buried collector, N+ type region 2, thereby reducing collector resistance. Between the P-type region 3 and the oxide film 9 formed thereabove, a P-type region 6 is formed. The P-type region acts as an element-isolating layer and thus electrically separates bipolar transistors TR1 and TR 2.

Hereinbelow, the process for manufacturing the element isolating construct shown in FIG. 10 will be explained with reference to the cross sectional view of the construct on the way of manufacturing shown in FIG. 11. From the beginning to the step of forming an epitaxial layer 5, the same steps as those of the first embodiment are repeated (see FIG. 7), thereby omitting brief explanation thereof. When the present invention is applied to an integrated circuit having an element-isolating construct using LOCOS, a P-type region 3 is formed by ion implantation after an oxide film 9 is formed by LOCOS, as shown in FIG. 11. Impurity ions must be injected deeply at an acceleration voltage as strong as 1 MeV to pass through the oxide film 9 and epitaxial layer 5. However, since no high temperature heating step is performed after LOCOS, impurities must be injected only at a low acceleration voltage to form a P-type region 6 under the LOCOS oxidation film 9 (see FIG. 10).

If the construct and the process of the present invention are employed, it is possible to form a semiconductor circuit having a reduced isolation distance between transistors and a reduced collector/substrate capacitance, at low cost, similarly to the first embodiment.

In the foregoing, we described the embodiments of the present invention, taking a bipolar transistor integrated circuit by way of example. The present invention is, of course, used in a hybrid integrated circuit, the so-called BiCMOS integrated circuit, consisting of bipolar transistors and MOS transistors, for isolating adjacent bipolar transistors and a MOS transistor from an adjacent bipolar transistor.

Figure 12:
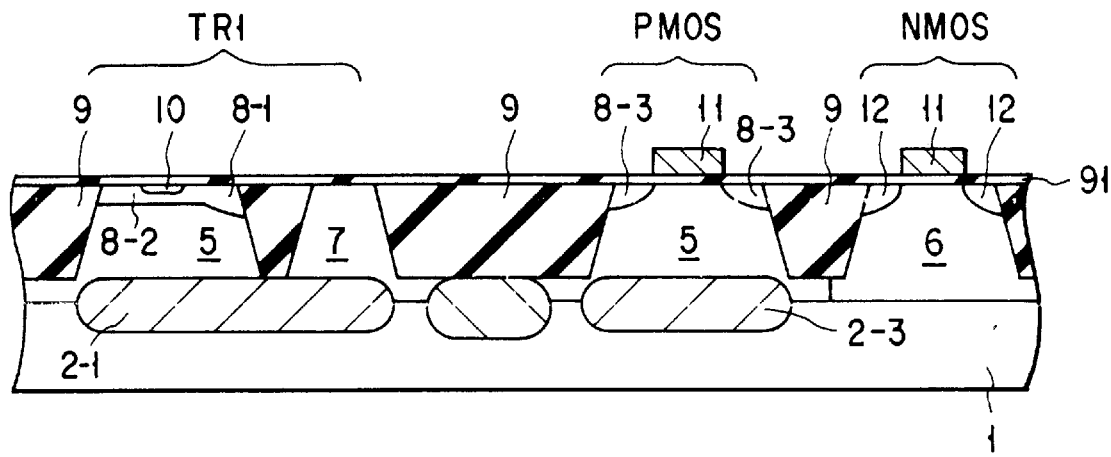
FIG. 12 is a cross sectional view of the element-isolating construct of the semiconductor integrated circuit according to a third embodiment of the present invention.

FIG. 12 is a cross sectional view showing an element-isolating construct of the semiconductor integrated circuit according to a third embodiment of the present invention, and more specifically, an element-isolating construct of the present invention adopted to the BiCMOS integrated circuit. The structure of the element-isolating construct and bipolar transistor TR1 are the same as those of FIG. 5.

In a P-channel MOS transistor region (PMOS), a buried $N^+$ type region 2-3 is formed on a P-type semiconductor substrate 1. The $N^+$ type region 2-3 is formed in the same manner as in $N^+$ the region 2-2 shown in FIG. 5. On the surface of the epitaxial layer 5 surrounded with an oxidation film 9 for isolation, a P-type region 8-3 serving as a source/drain region is formed with a gate electrode 11 on the gate oxide film 91 interposed therebetween. The region 8-3 is formed in the same step as that of forming the P-type region 8-1 serving as the base contact, in the manufacturing process of bipolar transistor TR1. In an N-channel MOS transistor region (NMOS), P-type impurities are introduced into the epitaxial layer 5 surrounded with the oxidation film 9 for isolation, to form a P-type region 6. In the surface of the P-type region 6, an N-type region 12 is formed as a source/drain region with the gate electrode 11 on the gate oxide film 91 interposed therebetween.

Figure 13:
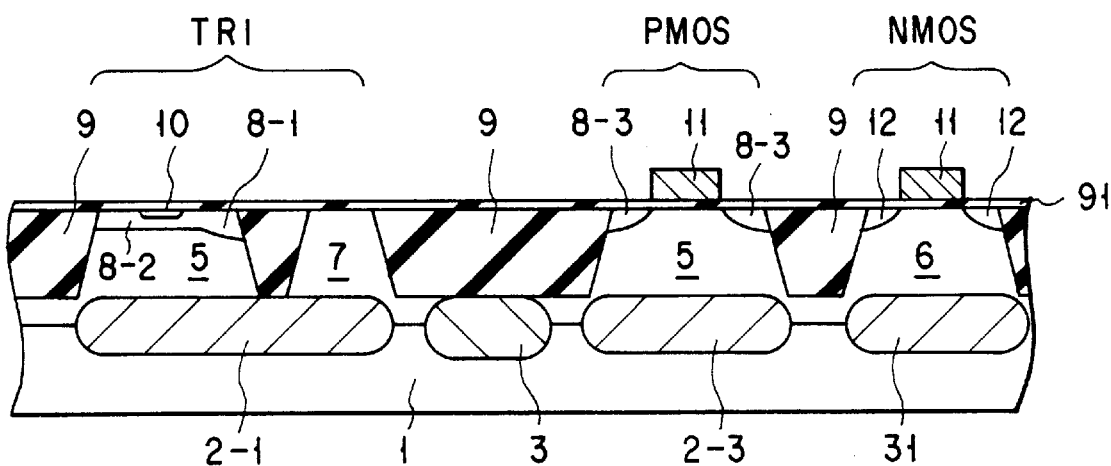
FIG. 13 is a cross sectional view of the element-isolating construct of the semiconductor integrated circuit according to a fourth embodiment of the present invention.

FIG. 13 is a cross sectional view showing an element-isolating construct of a semiconductor integrated circuit according to a fourth embodiment of the present invention. Different from the construct shown in FIG. 12, the construct of FIG. 13 has a buried P-type region 31. The P-type region 31 is formed prior to the epitaxial growth, similarly to $N^+$ type regions 2-1 and 2-2. It should be noted that the P-type region 31 is formed differently from the processing step of P-type region 3, which is a characteristic step in the present invention.

From the embodiments of FIG. 12 and FIG. 13, it is apparent that the element-isolating construct and the process of the present invention are effective. More specifically, the diffusion of the impurities from the buried P-type region 3 for isolating elements is successfully suppressed and thereby the P-type region 3 is not contact with adjacent $N^+$ type regions 2-1 and 2-3. As a result, the distance between the $N^+$ type region 2-1 and 2-3 can be reduced, preventing an increase in capacitive coupling. Hence, highly integrated circuit with high performance can be obtained at a low manufacturing cost.

Figure 14:
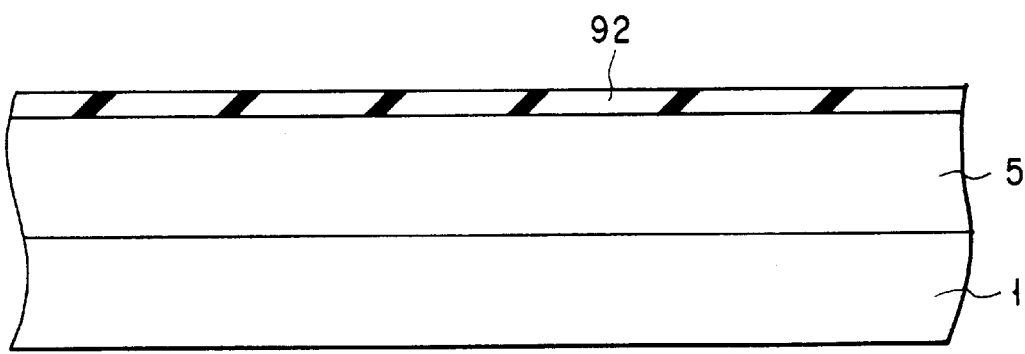
FIG. 14 is a first cross sectional view of the element-isolating construct on the way of manufacturing the construct of an application example according to the aforementioned embodiments, for use in explaining the manufacturing process.
Figure 15:
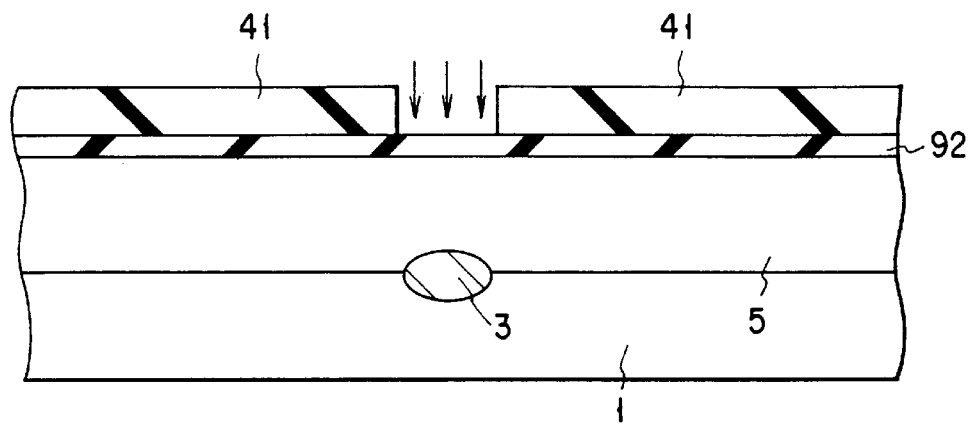
FIG. 15 is a second cross sectional view of the element isolating construct in a manufacturing step following FIG. 14.
Figure 16:
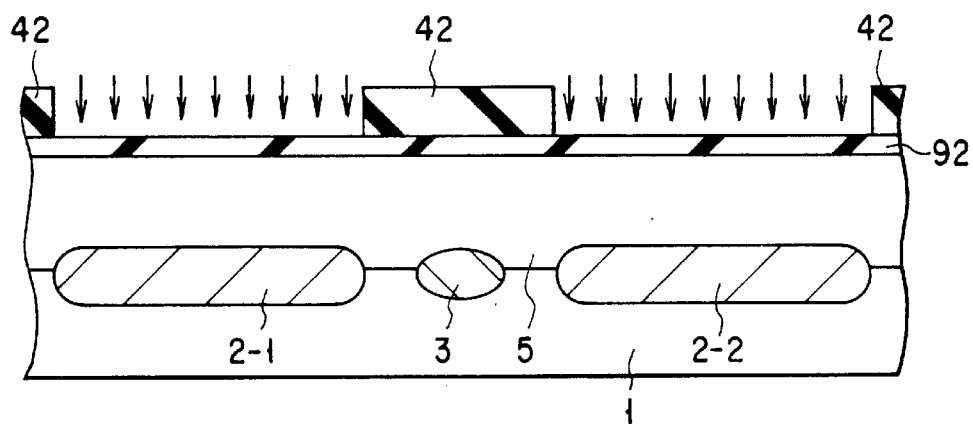
FIG. 16 is a third cross sectional view of the element-isolating construct in a manufacturing step following FIG. 15.

Incidentally, in each of the aforementioned embodiments, the $N^+$ type regions 2-1 and 2-2 may be selectively formed by ion implantation after epitaxial layer 5 is grown, as shown in FIGS. 14 to 16. As is indicated in FIG. 14, first, an N-epitaxial layer 5 is grown on a P-type semiconductor substrate 1. Over the N-epitaxial layer 5, a protecting film such as an oxide film 92 is formed. After a resist film 41 is formed on the oxide film 92 excluding a predetermined element-isolating region, as shown in FIG. 15, a P-type region 3 is selectively formed by ion implantation only in the bipolar transistor isolating region. In this case, Impurity ions must be injected deeply at an acceleration voltage as strong as 1 MeV to pass through the oxide film 92 and epitaxial layer 5. After a resist film 42 is formed by ion implantation on the oxide film 92 above the predetermined buried $N^+$ type regions 2-1 and 2-2, the $N^+$ type regions 2-1 and 2-2 are selectively formed. Also in this case, an accelerating voltage of about 1 MeV is required since impurities must be implanted deeply to pass through the oxide film 92 and the epitaxial layer 5.

In the aforementioned process, the $N^+$ type regions 2-1 and 2-2 may be formed first and the P-type region 3 later. In either case, the resist films 41 and 42 must be formed in such a manner that the buried layers will not be in contact with each other even if heating treatment is performed later. After completion of the $N^+$ type regions 2-1, 2-2, and P-type region 3, the oxide film 92 is removed. Subsequently, element-isolating regions and elements are formed, for example, as shown in FIG. 5.

As is explained in the foregoing, the distance between adjacent transistors can be reduced without using a deep trench isolation technique requiring other isolation techniques and without increasing the collector/substrate capacitive coupling. The present invention made it possible to provide the element isolating construct and the process for use in forming a semiconductor integrated circuit directing to an inexpensive, high performance, and highly integrated bipolar transistor integrated circuits and BiCMOS integrated circuits.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A process for manufacturing an element-isolating construct of a semiconductor integrated circuit, comprising the steps of:

selectively forming buried impurity regions of a second conductive type corresponding to each of element regions, on a semiconductor substrate of a first conductive type;

growing an epitaxial layer of a second conductive type over said semiconductor substrate including said buried impurity regions of a second conductive type, said epitaxial layer containing impurities of a second conductive type in a smaller amount than said buried impurity regions of a second conductive type, forming a buried impurity region of a first conductive type in said semiconductor substrate, apart from said buried impurity regions of a second conductive type to electrically isolate said buried impurity regions of a second conductive type, by ion implantation injecting ions through a surface of said epitaxial layer above a predetermined position of said buried impurity region of a first conductive type at a doping concentration higher than that of said semiconductor substrate, and isolating each of said element regions on said buried impurity regions of a second conductive type, wherein said buried impurity region of a first conductive type is formed not in contact with said buried impurity regions of a second conductive type even after the requisite heating is applied, and an impurity concentration of a first conductive type contained in the peripheral portions of said buried impurity regions of a second conductive type is equal to an impurity concentration of a first conductive type of said semiconductor substrate.

2. The process for manufacturing an element-isolating construct according to claim 1, wherein said buried impurity region of a first conductive type is formed by said ion implantation method after said epitaxial layer is partially removed by etching.

3. The process for manufacturing an element-isolating construct according to claim 1, wherein, in said isolation step, element regions are separated by forming an element-isolating layer of a first conductive type in contact with said buried impurity region of a first conductive type, in said epitaxial layer, by use of local oxidation (LOCOS).

4. The process for manufacturing an element-isolating construct according to claim 2, wherein, in said isolation step, element regions are separated by forming an insulating film serving as an element isolating layer in a partially etch-removed portion of said epitaxial layer, in contact with said buried impurity region of a first conductive type.

5. A process for manufacturing an element-isolating construct of a semiconductor integrated circuit comprising the steps of:

growing an epitaxial layer of a second conductive type over a semiconductor substrate of a first conductive type;

forming buried impurity regions of a second conductive type corresponding to each of element regions and a buried impurity region of a first conductive type for isolating said buried impurity regions of a second conductive type from each other, in the surface region of said semiconductor substrate by ion implantation injecting ions through a surface of said epitaxial layer; and isolating each of said element regions formed on said buried impurity regions of a second conductive type, wherein said buried impurity region of a first conductive type is formed not in contact with said buried impurity regions of a second conductive type even after the requisite heating is applied, and an impurity concentration of a first conductive type contained in the peripheral portions of said buried impurity regions of a second conductive type is equal to an impurity concentration of a first conductive type of said semiconductor substrate.

6. The process for manufacturing an element-isolating construct according to claim 1, wherein, in said isolation step, element regions are separated by forming an element-isolating layer of a first conductive type in contact with said buried impurity region of a first conductive type, in said epitaxial layer, by use of local oxidation (LOCOS).

7. The process for manufacturing an element-isolating construct according to claim 5, wherein, in said isolation step, element regions are separated by forming an insulating film serving as an element isolating layer in a partially etch-removed portion of said epitaxial layer, in contact with said buried impurity region of a first conductive type.

* * * * *